United States Patent
Perry et al.

(10) Patent No.: US 9,553,591 B2
(45) Date of Patent: Jan. 24, 2017

(54) HYBRID ARCHITECTURE FOR SIGNAL PROCESSING

(71) Applicant: Altera Corporation, San Jose, CA (US)

(72) Inventors: Steven Perry, Sands High Wycombe (GB); Martin Langhammer, Salisbury (GB); Richard Maiden, Menlo Park, CA (US)

(73) Assignee: ALTERA CORPORATION, San Jose, CA (US)

(*) Notice: Subject to any disclaimer, the term of this patent is extended or adjusted under 35 U.S.C. 154(b) by 185 days.

(21) Appl. No.: 14/492,717

(22) Filed: Sep. 22, 2014

(65) Prior Publication Data

US 2015/0088948 A1  Mar. 26, 2015

Related U.S. Application Data

(60) Provisional application No. 61/880,275, filed on Sep. 20, 2013.

(51) Int. Cl.
| | | |
|---|---|---|
| *G06F 17/10* | (2006.01) | |
| *H03K 19/177* | (2006.01) | |
| *G06F 1/02* | (2006.01) | |
| *G06F 17/50* | (2006.01) | |

(52) U.S. Cl.
CPC ......... *H03K 19/17748* (2013.01); *G06F 1/02* (2013.01); *G06F 17/505* (2013.01); *G06F 17/5054* (2013.01); *H03K 19/1776* (2013.01)

(58) Field of Classification Search
None
See application file for complete search history.

(56) References Cited

U.S. PATENT DOCUMENTS

| | | | |
|---|---|---|---|
| 6,288,569 B1 | 9/2001 | Wittig et al. | |
| 6,680,476 B1* | 1/2004 | Hidalgo | H01J 49/0036 250/281 |
| 7,224,721 B2 | 5/2007 | Betz et al. | |
| 8,369,177 B2 | 2/2013 | Hold et al. | |
| 8,967,980 B2* | 3/2015 | Fitton | F04D 25/08 417/178 |
| 2003/0142873 A1* | 7/2003 | Lafruit | G06F 17/148 382/240 |
| 2007/0038843 A1 | 2/2007 | Trivedi et al. | |
| 2007/0043479 A1 | 2/2007 | Heiland et al. | |
| 2011/0264888 A1 | 10/2011 | Dasu et al. | |
| 2012/0264476 A1* | 10/2012 | Kleinhenz | H04L 1/0026 455/517 |
| 2013/0151458 A1 | 6/2013 | Indeck et al. | |
| 2015/0088948 A1* | 3/2015 | Perry | G06F 1/02 708/230 |

FOREIGN PATENT DOCUMENTS

JP    2013533466 A    8/2013

OTHER PUBLICATIONS

International Search Report and Written Opinion dated Dec. 19, 2014 in International Application No. PCT/US2014/056803.

* cited by examiner

*Primary Examiner* — David H Malzahn

(57) ABSTRACT

Systems and methods of configuring a programmable integrated circuit. An array of signal processing accelerators (SPAs) is included in the programmable integrated circuit. The array of SPAs is separate from a field programmable gate array (FPGA), and the array of SPAs is configured to receive input data from the FPGA and is programmable to perform at least a filtering function on the input data to obtain output data.

24 Claims, 7 Drawing Sheets

1000

| 1002 CONFIGURE AN ARRAY OF SIGNAL PROCESSING ACCELERATORS (SPAS), WHICH IS SEPARATE FROM A FIELD PROGRAMMABLE GATE ARRAY (FPGA), TO RECEIVE INPUT DATA FROM THE FPGA AND PERFORM AT LEAST A FILTERING FUNCTION ON THE INPUT DATA TO OBTAIN OUTPUT DATA |
|---|

| 1004 CONFIGURE, USING A SWITCHING CIRCUITRY, CONNECTIONS BETWEEN PAIRS OF SPAS IN THE ARRAY OF SPAS, WHEREIN THE ARRAY OF SPAS IS ARRANGED IN A TWO-DIMENSIONAL MESH OF SPAS |
|---|

FIG. 10

HYBRID ARCHITECTURE FOR SIGNAL PROCESSING

CROSS-REFERENCE TO RELATED APPLICATIONS

This claims the benefit of U.S. Provisional Application No. 61/880,275, filed Sep. 20, 2013, the disclosure of which is incorporated herein by reference in its entirety.

BACKGROUND OF THE DISCLOSURE

Generally, programmable logic devices (PLDs) such as field programmable gate arrays (FPGAs), include thousands of programmable logic cells that perform logic operations. For example, each such logic element ("LE") may include a look-up table ("LUT"), a register, and a small amount of other circuitry. The LUT may be programmable to produce an output signal that is any logical combination or function of the inputs to the LUT. The LE may be programmable with respect to whether and how the register is used, and what control signals (e.g., clock, clock enable, clear, etc.) are selected for application to the register. In addition to the LEs, an FPGA typically includes programmable interconnection circuitry for conveying signals to, from, and/or between the LEs in any of many different ways. This allows the relatively simple logic capabilities of individual LEs to be concatenated to perform logic tasks of considerable complexity.

It has become increasingly standard in FPGA architectures to add dedicated or "hard" blocks to programmable logic to add common functionality to the FPGA. These functional blocks incorporate specialized logic devices adapted to specific logic operations, such as serializers, deserializers, filters, adders, multiply and accumulate (MAC) circuits, and phase-locked loops (PLL). The logic cells and functional blocks are interconnected by a configurable interconnect network. The configurable interconnect network selectively routes connections between and among the logic cells and functional blocks. By configuring the combination of logic cells, functional blocks, and the interconnect network, a programmable device can be adapted to perform virtually any type of information processing function. Specialized blocks that are added to an FPGA may decrease the size of a function or to improve performance of a speed-critical block. A further attraction of specialized blocks is that the fixed implementation provides the benefit of a consistent implementation, reducing the effort of timing closure.

One of the main properties of specialized blocks is that they tend to provide dramatic benefits when used. However, it is rare that all the specialized blocks are used and sometimes specialized blocks are not used at all. Some of the major hurdles in adding specialized blocks to FPGAs are that 1) specialized blocks are a great advantage for some users, but may sometimes be wasted area for other users, and 2) it is not cost-efficient to make a family of FPGAs with too many different members and variations, and often it is not known until long after the device is defined which specialized blocks should be included in a design.

SUMMARY OF THE DISCLOSURE

This disclosure relates to integrated circuit devices, and particularly to such devices having a hybrid architecture for signal processing.

In accordance with embodiments of the present invention, systems and methods for configuring a programmable integrated circuit device are disclosed. The programmable integrated circuit includes an array of signal processing accelerators (SPAs). The array of SPAs is separate from a field programmable gate array (FPGA), and the array of SPAs is configured to receive input data from the FPGA and is programmable to perform at least a filtering function on the input data to obtain output data.

In some embodiments, the programmable integrated circuit includes a configurable interconnect network that configures connections between pairs of SPAs in the array of SPAs, wherein the array of SPAs is arranged in a two-dimensional mesh of SPAs. The array of SPAs may be arranged in at least two two-dimensional meshes of SPAs, and the configurable interconnect network may include one or more connections between the at least two two-dimensional meshes, such that at least one of the at least two two-dimensional meshes is bypassed in a particular configuration of the configurable interconnect network. The configurable interconnect network may be set when the FPGA is configured.

The programmable integrated circuit may include at least one input memory buffer that provides data to a first SPA in the array of SPAs, at least one output memory buffer that receives data from a first SPA in the array of SPAs, or both. When there are both at least one input memory buffer and at least one output memory buffer, the SPA that receives data from an input memory buffer may or may not be the same as the SPA that provides data to an output memory buffer. At least some of the SPAs in the array of SPAs may each include at least three memory blocks, an adder, a multiplier, and an accumulator. In some embodiments, at least two SPAs in the array of SPAs are arranged to process the same input data.

In some embodiments, the programmable integrated circuit includes a SPA controller that transmits instructions to the array of SPAs. The SPA controller may receive programming instructions from a hard processor subsystem that shares a die with the FPGA. The hard processor subsystem may include a network-on-a-chip and at least one CPU that communicates with the SPA controller via the network-on-a-chip. The network-on-a-chip on the hard processor subsystem may communicate with the SPA controller via another network-on-a-chip in a processor region including a plurality of digital signal processors (DSPs).

BRIEF DESCRIPTION OF THE DRAWINGS

Further features of the disclosed techniques, their nature and various advantages, will be apparent upon consideration of the following detailed description, taken in conjunction with the accompanying drawings, in which like reference characters refer to like parts throughout, and in which:

FIG. 10 shows an illustrative flow diagram of a process for configuring a programmable integrated circuit, in accordance with an implementation.

DETAILED DESCRIPTION OF THE DISCLOSURE

The systems and methods of the present disclosure include a hybrid architecture of an integrated circuit for signal processing. Different types of embedded features may operate in concert, connected by specially-purposed busses, such as network-on-a-chip (NoC) systems. Additionally or alternatively, one feature may be connected in a configurable manner to another feature having the same type, thereby constructing a more powerful application-specific accelerator.

It is generally desirable to create integrated circuits that are cheaper and consume less power, while being able to provide desired functionality and maintain a level of programmability. The hybrid architecture described herein uses a programmable architecture that includes a mix of programmable elements, such as FPGAs, accelerators, and processors, for example. Essentially, the hybrid architecture described herein has the low cost and low power consumption properties of ASICs, but has the programmability of FPGAs.

Figure 1:
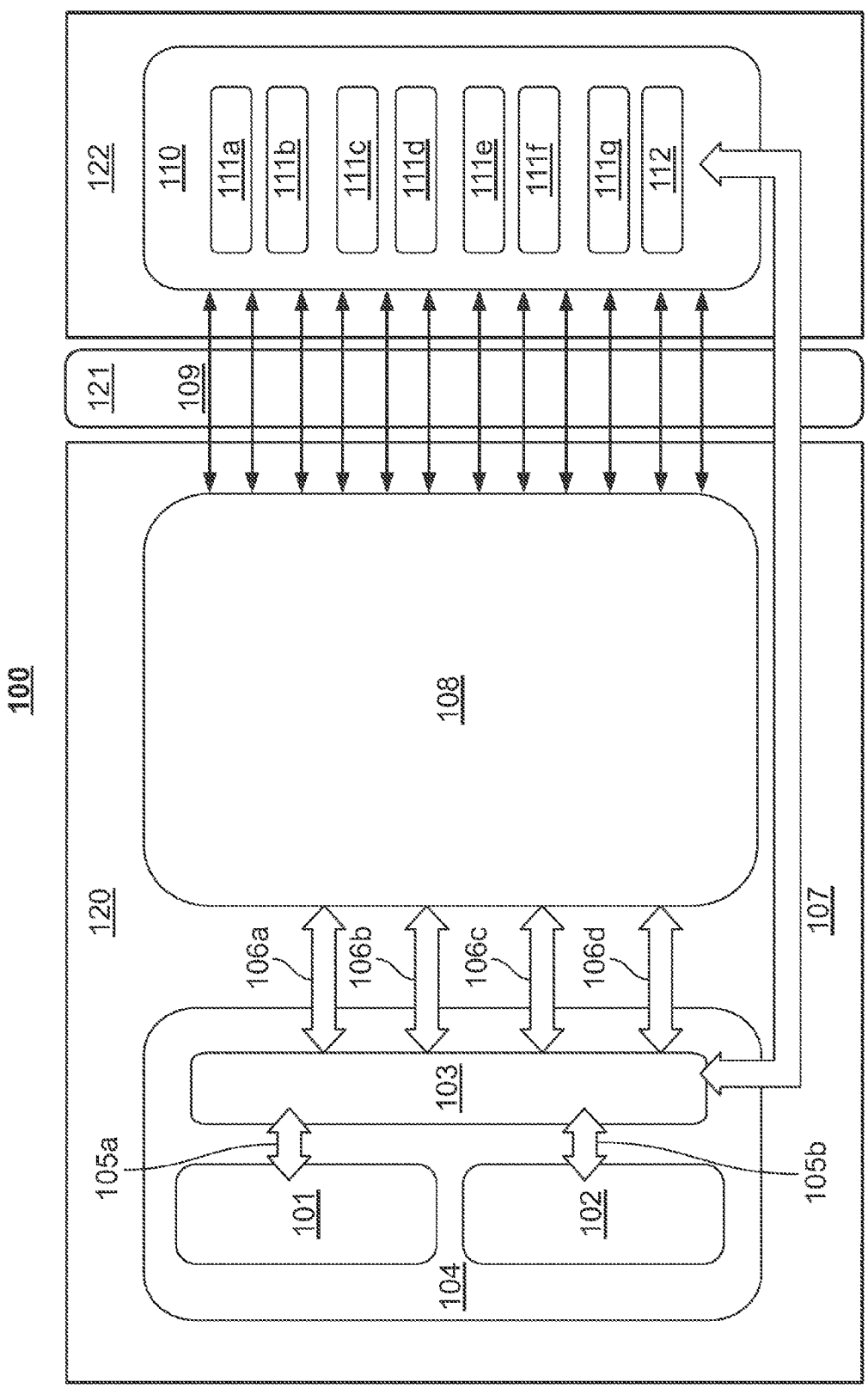
FIG. 1 shows an illustrative floorplan of a hybrid system, in accordance with an implementation.

FIG. 1 depicts an illustrative floorplan 100 of a hybrid system, in accordance with an implementation. The floorplan 100 depicts various illustrative blocks of a hybrid system. The floorplan 100 includes a hard processor subsystem (HPS) 104, an FPGA 108, and an array 110 of signal processing accelerators (SPAs). The HPS 104 communicates with the FPGA 108 over connections 106a-106b (generally, connection 106) and with the array 110 of SPAs over connection 107, and the FPGA 108 communicates with the array 110 of SPAs over connections 109.

The array 110 of SPAs includes seven SPAs 111a-111g (generally, SPA 111), each of which processes input data and is controlled by SPA controller 112. Each SPA 111 is essentially a programmable filtering block that is capable of supporting filtering and related DSP functions. Examples of such functions include but are not limited to polynomial manipulation (in cases that involve digital pre-distortion (DPD), NCO, trigonometry, or any other suitable process, for example), simple gain or mixing, or other arithmetic functions such as $x^n$, 1/x, log, square root, absolute value, or x/y. The array 110 of SPAs 111 does not require any soft logic.

Various examples of the components of each SPA 111 or the array 110 of SPAs are shown and described in relation to FIGS. 3-9. In particular, the SPAs 111 may be arranged in an array of block-like structures, have programmable connectivity with one another, and have embedded memory for storing data, such as coefficient data. As is described in more detail in relation to FIGS. 6-8, the SPAs 111 may support functions such as filtering including complex filtering, polynomial manipulation, fixed point arithmetic, square root, division, and other similar functions.

In FIG. 1, the array 110 is on a region 122, and the FPGA 108 and HPS 104 are formed on another region 120. The array 110 of SPAs communicates with the FPGA 108 over the connection 109, which may include one or more connection busses. When the regions 120 and 122 are formed on separate dies, the connection 109 may be part of an interposer 121 that exists between the two dies. Alternatively, the regions 120 and 122 may be formed on the same die. In general, the array 110 (or a portion thereof) may be formed on the same die as the FPGA 108 or a different die.

The HPS 104 may include one or more embedded CPUs 101 and 102, which communicate with a network-on-a-chip (NoC) 103 over connections 105a and 105b, respectively. The NoC 103 serves as an interface between the embedded CPUs 101 and 102 and the FPGA 108, and between the embedded CPUs 101 and 102 and a SPA controller 112. The HPS 104 may perform functions such as any software function related to control or application specific functions. In particular, the embedded CPUs 101 and 102 may be configured to program the SPA controller 112 over the connection 107 so that the SPA controller 112 may send suitable instructions to each of the SPAs 111 in the array 110. In some embodiments, the HPS 104 is an optional processor subsystem and may not be included in the systems described herein.

In the floorplan 100 of FIG. 1, two CPUs 101 and 102 and seven SPAs 111 are implemented. In general, one of ordinary skill in the art will understand that any number of any of the components of FIG. 1 may be implemented without departing from the scope of the present disclosure.

The hybrid system of FIG. 1 may be designed for implementing a digital front end (DFE) system. In this case, the array 110 of SPAs 111 supports the processing performed in the filtering and polynomial manipulation for digital up conversion (DUC), digital down conversion (DDC), numerically controlled oscillator (NCO), crest factor reduction (CFR), and digital pre-distortion (DPD). The HPS 104 supports functionality related to control and monitoring, and a separate hard DSP subsystem (not explicitly shown in FIG. 1) may support functionality related to matrix inversion, FFT processing, low-sample rate DSP, and floating point arithmetic. Finally, the FPGA 108 supports any I/O protocols (such as CPRI or JESD204B, for example), switching, and any other suitable functionality.

Figure 2:
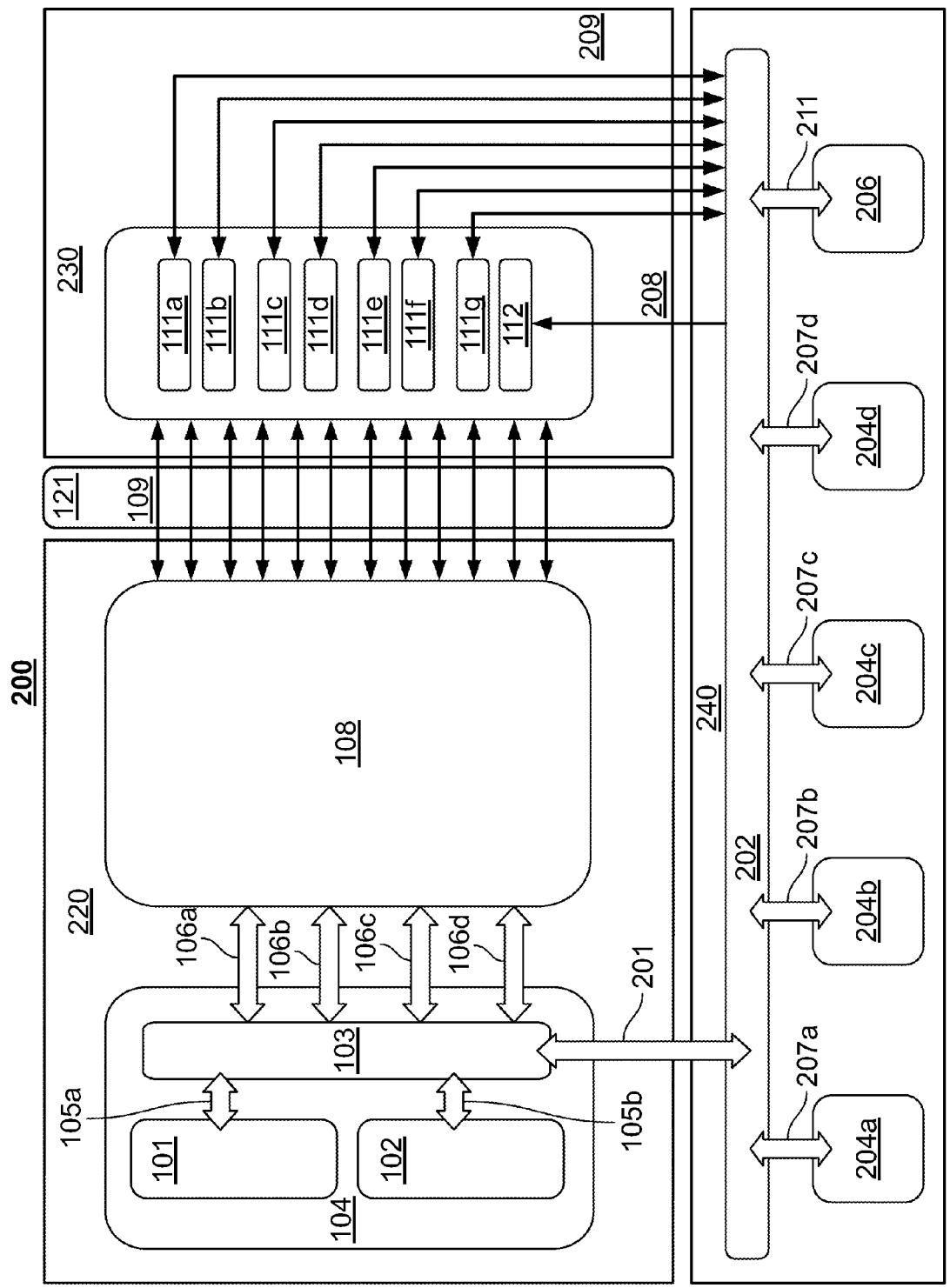
FIG. 2 shows an illustrative floorplan of a hybrid system including a DSP processor region, in accordance with an implementation.

FIG. 2 is an illustrative floorplan 200 of a hybrid system including a DSP processor region, in accordance with an implementation. The floorplan 200 is similar to the floorplan 100 of FIG. 1, with the addition of a DSP or processor region 240 that replaces the connection 107 in FIG. 1. The processor region 240 may be part of the same die as the die on which the region 220 (that houses the HPS 104 and the FPGA 108) is formed, or the processor region 240 may be formed on a separate die.

As shown in FIG. 2, the processor region 240 includes four DSP processors 204a-204d (generally, DSP processor 204), as well as a unit 206, which may be a pooled memory unit or an application specific processor such as a forward error correction (FEC) block. The processor region 240 further includes an NoC 202 that serves as an interface between the DSP processors 204, the unit 206, the array of SPAs 111, the SPA controller 112, and the NoC 103. Additional units such as unit 206 may be connected through to NoC 202. For example, any number of application specific accelerators or processor, memory units, and/or DSP processors may be connected to NoC 202. Each DSP processor 204 connects to the NoC 202 using one of the connections 207a-207d (generally, connection 207), which may include one or more AXI busses. When the processor region 240 is on a separate die from the region 220, a connection 201 (which may include one or more AXI busses) connects the NoCs 202 and 103.

As was described in relation to FIG. 1, the FPGA 108 in the floorplan 200 may directly transfer data to and from the SPAs 111. The DSP processors 204 may transfer data to and from the SPAs 111 over the NoC 202 and the connections 209, and may load program data into the SPA controller 112 over the NoC 202 and the connection 208. In the system shown in the floorplan 200, the DSP processors 204 may perform all or some of the signal processing, and may use the SPA region 230 to offload some simpler, but computationally dense functions, such as FIR filters, polynomial manipulation, or arithmetic functions. Moreover, other types of more complex signal processing acceleration (such as forward error correction) may be performed by unit 206 (which may be an application specific accelerator) or by the SPA region 230.

Figure 3:
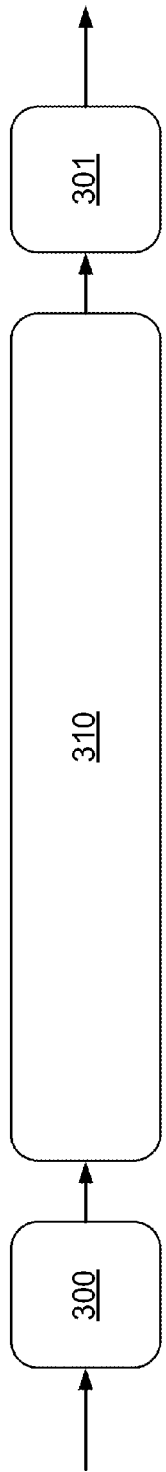
FIG. 3 shows an illustrative block diagram of a SPA and its input and output, according to an illustrative implementation.

FIG. 3 is an illustrative block diagram of a SPA 310 and its input and output, according to an illustrative implementation. The SPA 310 of FIG. 3 may be used to implement any or all of the SPAs 111 shown and described in relation to FIGS. 1 and 2. The SPA 310 has a relatively small number of input ports and a small number output ports. The relatively smaller number of input and output ports causes the SPA 310 to be less flexible yet more efficient than existing FPGAs for applications such as FIR filters. In particular, the number of input and output ports for a SPA may depend on the dimensions of the array or mesh of SPAs, where the larger the array or mesh, the higher the number of input and output ports. In an example, a SPA may have just four input and output ports, and all of the input and output ports may have the same width, which may be 18 bits wide. In contrast, an existing FPGA may be configured to be able to route to and from anywhere on a chip. By restricting the numbers of inputs and outputs of a SPA and arranging the SPAs in an array or a mesh, the present disclosure limits the flexibility of the connections but saves on power consumption and improves efficiency.

As shown in FIG. 3, only one input from an input memory 300 and one output to an output memory 301 is shown, but in general, any number of inputs from any number of input memories and any number of outputs to any number of output memories may be used. The number of inputs may or may not match the number of outputs. Similarly, the number of input memories may or may not match the number of output memories.

In some embodiments, the SPA 310 is connected to its source and sink directly, by one or more interfaces that support bursts of data. In particular, the input memory 300, the output memory 301, or both may be provided to balance the flow of the data in and out of the SPA 310. For example, one or both of input memory 300 and output memory 301 may be implemented as a FIFO buffer, such that the data flow in or out of the SPA 310 is balanced. In other words, the presence of FIFO buffers may allow for the SPA 310 to handle bursts of data flow.

For example, a large amount of data may be suddenly made available for the SPA 310 to process, but the SPA 310 may be busy processing other data. While the SPA 310 finishes processing the other data, the large amount of data may be held in a queue implemented by the input memory 300 so that the SPA 310 may process the large amount of data when the processing of the other data is complete. Similarly, if the data output by the SPA is transmitted to another unit such as a DSP processor before the unit is ready to process the data, the output data may be temporarily stored in the output memory 301 until the unit is ready. The inclusion of input memory 300 and the output memory 301 is useful for providing balancing to the data flow of the SPA 310 as long as on average, data is not written into the input memory 300 at a faster rate than the SPA 310 can read the data out. Similarly, the SPA 310 should not write data into the output memory 301 at a faster rate than the data is read out.

FIG. 3 shows one SPA 310, which may be implemented as including a set of multiple smaller accelerators. Examples of how multiple accelerators may be combined to form larger accelerators and sets of SPAs are shown and described in relation to FIGS. 4 and 5.

Figure 4:
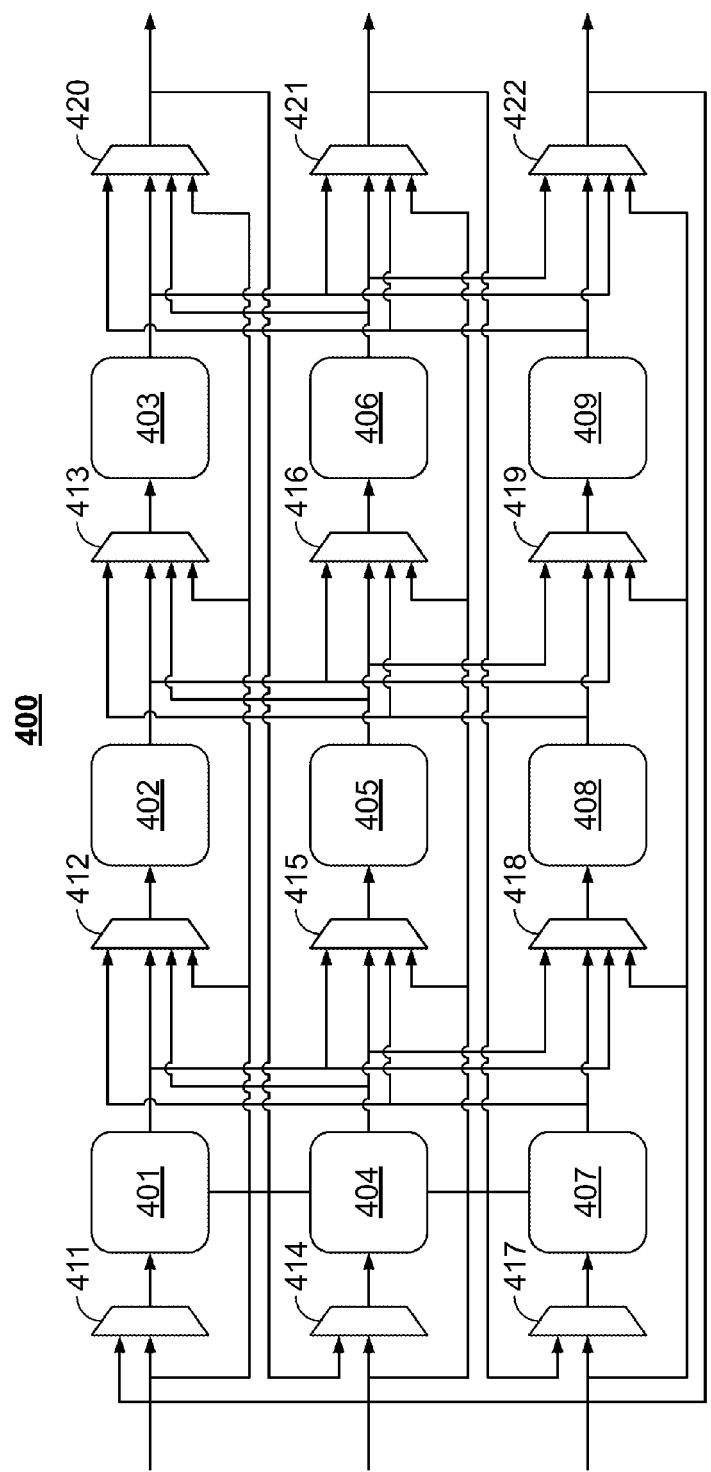
FIG. 4 shows an illustrative block diagram of multiple smaller accelerators that are connected to form a network 400 of accelerators, according to an illustrative implementation.

FIG. 4 is an illustrative block diagram of multiple smaller accelerators that are connected to form a network 400 of accelerators. The network 400 of accelerators may be described herein as a mesh routing fabric, and may be used to replace the SPA 310 shown in FIG. 3, or to replace any of the SPAs 111 shown in FIGS. 1 and 2. In the network 400, nine accelerators 401-409 form a 3×3 grid, and may be referred to as sub-accelerators. The network 400 is shown by way of illustrative example only, and in general, any number of accelerators may be used. In particular, many more accelerators may be used, and the aspect ratio of the structure may be different from the grid as shown. For example, the network 400 may include a grid of 4×4, 4×16, 1×64, etc. accelerators.

As is shown in FIG. 4, twelve multiplexers 411-422 provide the inputs to the accelerators 401-409 and/or receive the outputs of the accelerators 401-409 and effectively form a configurable interconnect network that determines how the accelerators 401-409 are connected. The control signals used for selecting appropriate inputs of the multiplexers 411-422 may be set when the device is programmed at the configuration time of the FPGA. The connections in FIG. 4 may include one or more data busses, and indicate that each accelerator 401-409 may receive an input from its nearest neighbor, or it may be bypassed completely. In this manner, accelerators 401-409 are optionally involved in the processing, which allows for flexible routing of data.

Furthermore, each accelerator that is positioned at an endpoint of a row or column may be configured to accept an input from the other end point of that row or column, thereby providing a mesh or grid-like structure to the network 400. The mesh architecture shown in FIG. 4 may be used multiple times to form a hierarchical structure that is described in relation to FIG. 5.

Figure 5:
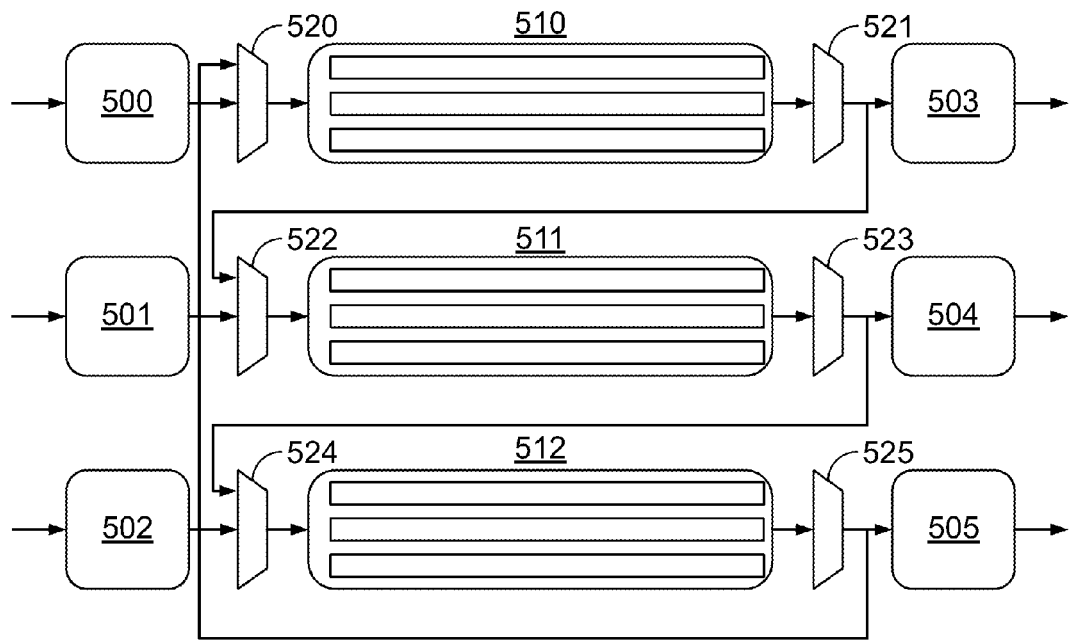
FIG. 5 shows an example block diagram of multiple meshes of accelerators, in accordance with an implementation.

FIG. 5 is an example block diagram of multiple meshes of accelerators. In particular, a group of three meshes 510, 511, and 512 are configured to receive inputs from and provide outputs to one another. Each mesh 510, 511, and 512 may include a mesh of sub-accelerators such as those shown in FIG. 4, or any other suitable mesh or grid of a number of small accelerators. Memory blocks 500-505 may be implemented as FIFOs and provide storage for the inputs to and the outputs from the meshes 510, 511, and 512. Moreover, as was described in relation to FIG. 3, the memory blocks 500-505 may provide balancing to the throughput of the meshes 510, 511, and 512.

A set of three input multiplexers 520, 522, and 524 provide input to each of the three meshes 510, 511, and 512, respectively, and a set of three output multiplexers 521, 522, and 523 receive the output of the three meshes 510, 511, and 512. As shown in FIG. 5, each output multiplexers 521, 522, and 523 receive only a single input, but in general, the output multiplexers 521, 522, and 523 may receive other inputs for additional flexibility. Alternatively, the output multiplexers 521, 522, and 523 may not be included in the system shown in FIG. 5.

As is shown in FIG. 5, the mesh 510 optionally receives input from the memory 500 or the output from the mesh 512, the mesh 511 optionally receives input from the memory 501 or the output of the mesh 510, and the mesh 512 optionally receives input from the memory 502 or the output of the mesh 511. By configuring the meshes 510, 511, and 512 in this manner, the meshes are allowed to communicate with each other in a limited manner, and the architecture shown in FIG. 5 advantageously limits the numbers of input and output ports of each mesh to save on cost and power consumption.

The individual accelerators within each mesh 510, 511, and 512 do not communicate directly with other individual accelerators in other meshes. For example, the accelerators in mesh 510 cannot communicate directly with the accelerators in mesh 511, and vice versa. The configuration of multiple meshes in this manner effectively constructs a hierarchy of connectivity that may be used to build more complex filter structures. Moreover, the lack of universal connectivity across the individual accelerators in different meshes allows for an efficient use of the physical area and reduces power consumption, compared to a system that has universal connectivity.

Two levels in the hierarchy of connectivity are shown in FIG. 5—an inter-SPA level and an inter-mesh level. In general, one of ordinary skill in the art will understand that additional levels may be used in the hierarchy of connectivity without departing from the scope of the present disclosure. In particular, additional levels may be used to support more complex system functions, such as a DFE system or an NCO subsystem, for example.

Figure 6:
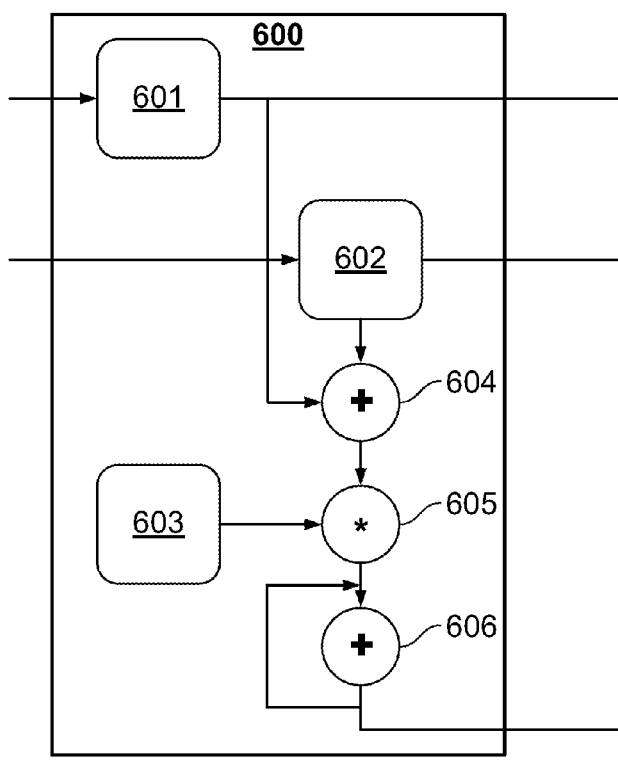
FIG. 6 shows an example block diagram of components of a SPA, in accordance with an implementation.

FIG. 6 is an example block diagram of the components of a SPA 600. The SPA 600 includes three memory blocks 601, 602, and 603, an adder 604, a multiplier 605, and an accumulator 606. Two data inputs are provided to the SPA 600, which stores the data inputs in the memory blocks 601 and 602. A controller (not shown) such as the SPA controller 112 shown in FIG. 1 may access the data that is stored in the memory blocks 601 and 602, and may transmit instructions to the SPA 600 to perform operations that are supported by the functional units in the SPA 600. For example, these operations may make use of the memory blocks 601-603, the adder 604, the multiplier, 605, the accumulator 606, or any suitable combination thereof.

In particular, the adder 604 performs the operation of summing the data that is stored in the memory blocks 601 and 602, the multiplier 605 performs the operation of multiplying the data stored in the memory block 603 with the sum produced by the adder 604, and the accumulator 606 performs the operation of accumulating the output of the multiplier 605. The output of the accumulator 606 may be provided into the mesh routing fabric of FIG. 4, and results may be input from other blocks (not shown) into the memory block 603. In some embodiments, multiple iterations of the summing performed by the adder 604, the multiplying performed by the multiplier 605, and the accumulating performed by the accumulator 606 may be performed before the output of the accumulator 606 is provided.

Figure 7:
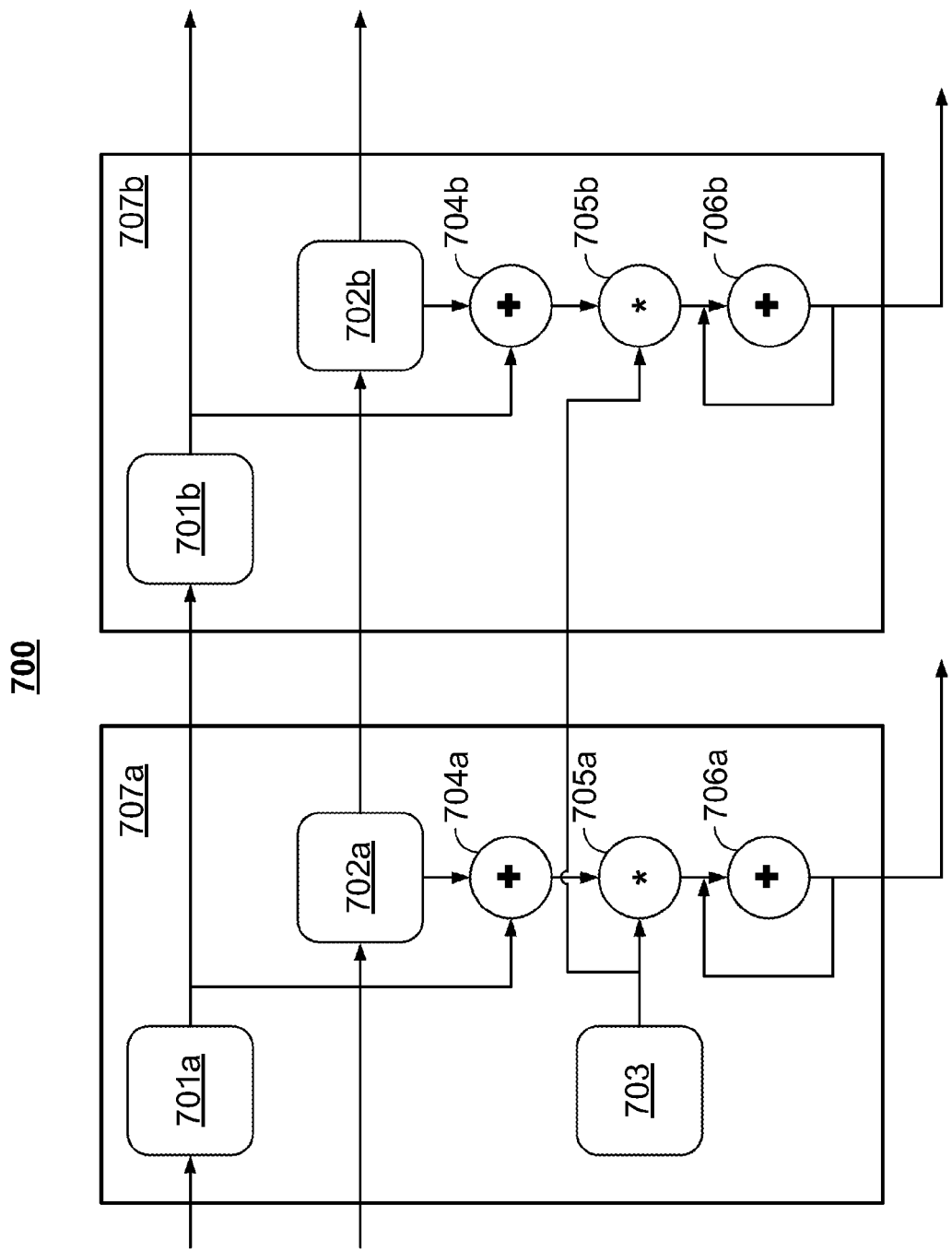
FIG. 7 shows an example block diagram of a system including two inter-connected SPAs, in accordance with an implementation.

FIG. 7 is an example block diagram of a system 700 including two SPAs connected together. The first SPA 707a may be identical to the SPA 600 shown and described in relation to FIG. 6, and includes three memory blocks 701a, 702a, and 703a, an adder 704a, a multiplier 705a, and an accumulator 706a. The second SPA 707b may be similar to the SPA 707a, but instead of including three memory blocks, the second SPA 707b includes two memory blocks 701b and 702b. Similar to the first SPA 707a, the second SPA 707b includes an adder 704b, a multiplier 705b, and an accumulator 706b.

The memory blocks 701a and 702a provide input to the memory blocks 701b and 702b, respectively, and the memory block 703 provides input to both multipliers 705a and 705b in both SPAs. The inter-SPA connections shown in FIG. 7 allow for both SPAs 707a and 707b to process the same data. When configured in this manner, a pair (or more) of SPAs may efficiently support applications in which it is desirable to implement multiple processes on the same set of data. As an example, pulse-Doppler signal processing may involve processing of I and Q signals, such that the SPA 707a may process I signals and the SPA 707b may process Q signals. As is shown in FIG. 7, the inter-SPA routing (e.g., the direct connections between the SPAs 707a and 707b) is provided on a pair of SPAs by pair of SPAs basis. However, the inter-SPA routing may be provided on a SPA-by-SPA basis.

Figure 8:
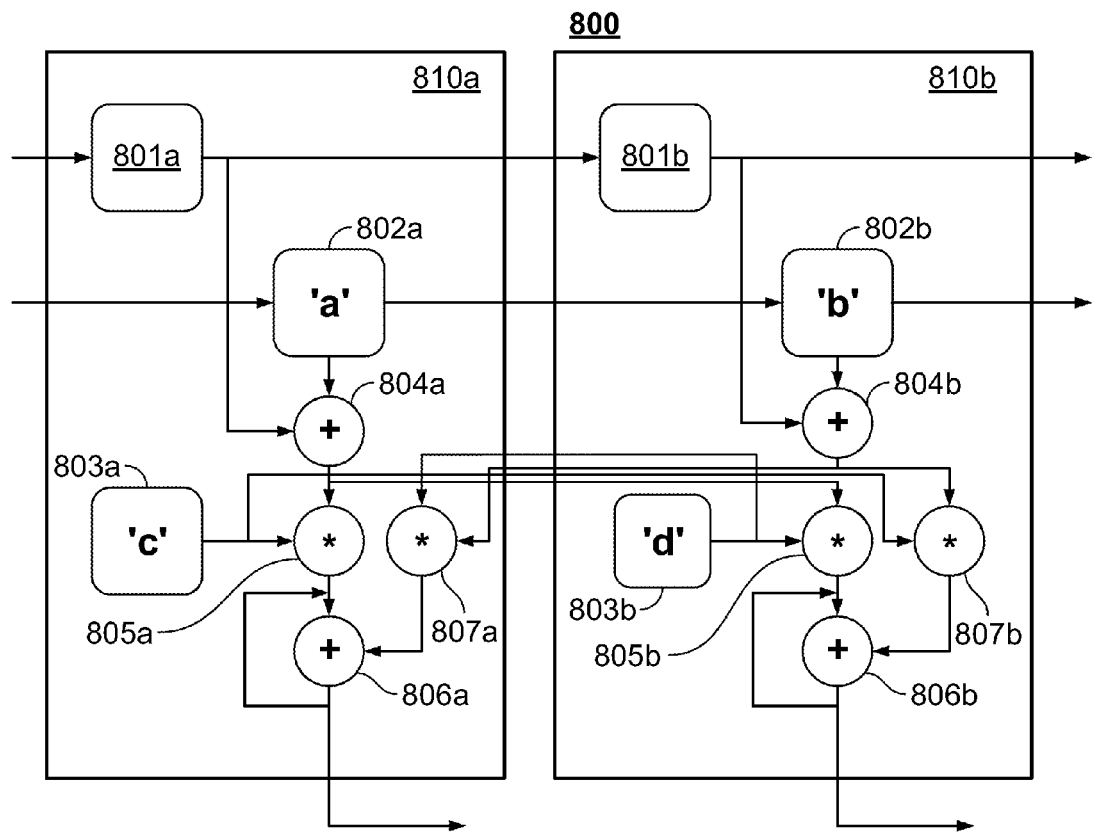
FIG. 8 shows an example block diagram of a system including two inter-connected SPAs that are used for complex filtering, in accordance with an implementation.

FIG. 8 is an example block diagram of a system 800 including two SPAs 810a and 810b that are connected together and are used for complex filtering. Each SPA 810a and 810b is similar to the SPA 600 shown and described in relation to FIG. 6, except that the SPAs 810a and 810b each include an additional multiplier. In particular, the SPA 810a includes three memory blocks 801a, 802a, and 803a, an adder 804a, two multipliers 805a, and 807a, and an accumulator 806a. Similarly, the SPA 810b includes three memory blocks 801b, 802b, and 803b, an adder 804b, two multipliers 805b and 807b, and an accumulator 806b.

For simplicity, if the data stored in the memory 802a is "a", the data stored in the memory 803a is "c", the data stored in the memory 802b is "b", and the data stored in the memory 803b is "d", then the configuration of the memory and functional units of FIG. 8 implements a complex multiplication, or $(ac-bd)+j(ad+bc)$. In particular, the SPA controller 112 may transmit instructions to the SPAs 810a and 810b to use or not use any of the connections shown in FIG. 8. For example, the SPA controller 112 may instruct that the connection from the memory 801a to the adder 804a and that the connection from the memory 801b to the adder 804b not be used. Furthermore, the instruction from the SPA controller 112 may include a control word that specifies one or more modifications to the functional units, such as using an adder or accumulator as a subtractor. Moreover, the use of the multipliers 807a and 807b may be optional, such that their inputs and/or outputs may be zeroed to achieve real multiplication instead of complex multiplication.

The SPA architecture shown in FIG. 8 may be optimized for performing complex filtering, and does not require any additional memory blocks compared to the SPAs shown in FIG. 6 or 7. Instead, only one additional multiplier (e.g., multipliers 807a and 807b) is used per SPA. In some embodiments, the presence of the additional multiplier 807a or 807b does not necessarily double the width of the arithmetic data path. In particular, the compressor trees corresponding to the multipliers 805a and 807a may be merged, such that only one carry-propagate adder (CPA) is needed.

Figure 9:
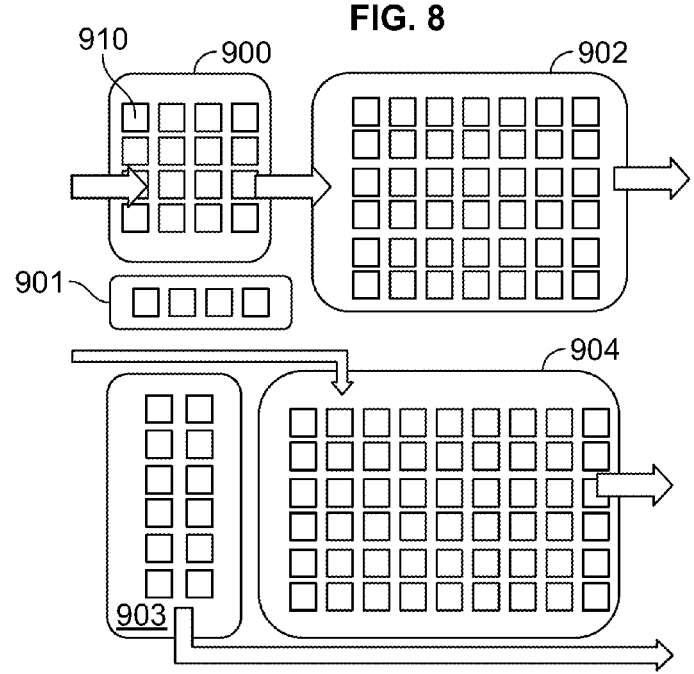
FIG. 9 shows an example diagram of a signal processing acceleration system that is partitioned over a group of SPAs, in accordance with an implementation.

FIG. 9 shows an example signal processing acceleration system that is partitioned over a group of SPAs 910. In particular, a group of SPAs 910 may be configured in a 12×12 mesh (not all 144 SPAs are shown). The group of SPAs 910 are partitioned into five meshes: meshes 900, 901, 902, 903, and 904, and the partition may be static, such that the groups cannot change dynamically. The mesh 900 is a 4×4 mesh that includes sixteen SPAs and receives input data from an FPGA (such as the FPGA 108) or a DSP processor (such as the DSP processor 204). The mesh 900 processes the input data and provides output data to the mesh 902, which is a 6×7 mesh that includes 42 SPAs. The mesh 902 processes the data using another process, and provides output data to the FPGA or the DSP processor.

The mesh 903 is a 6×2 mesh that does not receive input data and instead generates output data (such as data associated with an NCO, for example) and provides the output data to the FPGA or DSP processor regions. The processing performed by the mesh 903 and the output data that the mesh 903 provides bypasses the other meshes 900, 901, 902, and 904. The mesh 904 is a 6×9 mesh, which receives data from the FPGA or DSP processor regions, processes the data, and then provides output data to the FPGA or DSP processor regions.

As is shown in FIG. 9, the mesh 901 is not used, since the mesh 901 neither receives data nor provides any output data. In some embodiments, the mesh 901 is not used because all desired functions may be already implemented by the other meshes 900, 902, 903, and 904. In some embodiments, the mesh 901 is not used because the routing requirements for meshes 900, 902, 903, and 904 did not allow for enough remaining routing to use for routing the inputs and outputs of the mesh 901 (e.g., because the numbers of input ports and output ports is relatively limited).

FIG. 10 shows an illustrative flow diagram of a process 1000 for configuring a programmable integrated circuit. In particular, FIG. 10 illustrates the process of configuring an integrated circuit that includes an array of SPAs that is separate from an FPGA.

At 1002, the array of SPAs is configured to receive input data from the FPGA and perform at least a filtering function on the input data to obtain output data. As described in relation to FIG. 1, each SPA is essentially a programmable filtering block that is capable of supporting filtering and related DSP functions. Examples of such functions include but are not limited to polynomial manipulation (in cases that involve digital pre-distortion (DPD), NCO, trigonometry, or any other suitable process, for example), simple gain or mixing, or other arithmetic functions such as $x^n$, $1/x$, log, square root, absolute value, or $x/y$. The SPAs in the array of SPAs may be arranged in the grid-like manner shown in FIG. 4, in a hierarchical mesh structure shown in FIG. 5, in a grouped structure shown in FIG. 9, or any suitable combination thereof. Furthermore, the components of each SPA may be as is shown in FIGS. 6-8, and in particular, multiple SPAs in the array may process the same data, as is shown in FIG. 7.

At 1004, a configurable interconnect network is used to configure connections between pairs of SPAs in the array of SPAs, wherein the array of SPAs is arranged in a two-dimensional mesh of SPAs. For example, the network 400 shown and described in relation to FIG. 4 is one example of a two-dimensional mesh of SPAs. The network 400 forms a mesh routing fabric that provides connections between pairs of SPAs in the nine SPAs 401-409. As described in relation to FIG. 4, the network 400 may be used to replace the SPA 310 shown in FIG. 3, or to replace any of the SPAs 111 shown in FIGS. 1 and 2. The configurable interconnect network may include a set of multiplexers (such as the multiplexers 411-422 in FIG. 4) that determine how the SPAs 401-409 are connected, and the selection control signals for the multiplexers may be set at the configuration time of the FPGA.

In some embodiments, the array of SPAs is arranged in at least two two-dimensional meshes of SPAs, and the configurable interconnect network includes one or more connections between the at least two two-dimensional meshes, such that at least one of the at least two two-dimensional meshes is bypassed in a particular configuration of the configurable interconnect network. In particular, as is described in relation to FIG. 5, each mesh 510, 511, and 512 may include a mesh of sub-accelerators such as those shown in FIG. 4, or any other suitable mesh or grid of a number of small accelerators. Moreover, any of the meshes may be bypassed, depending on the particular configuration of the multiplexers in FIGS. 4 and 5 that form a configurable interconnect network.

In some embodiments, the programmable integrated circuit further includes at least one input memory buffer that provides data to a first SPA in the array of SPAs, and at least one output memory buffer that receives data from a second SPA in the array of SPAs. In particular, as described in relation to FIG. 3, input and output memory buffers may be implemented as FIFO buffers that balance the flow of the data in and out of the SPAs and enable bursts of data flow to be handled.

In some embodiments, the process 1000 further includes configuring a SPA controller (such as the SPA controller 112) to transmit instructions to the array of SPAs, and to receive programming instructions from an HPS (such as HPS 104) that shares a die with the FPGA. As shown in FIGS. 1 and 2, the HPS 104 may include an NoC 103 and at least one CPU, which may be configured to communicate with the SPA controller 112 via the NoC 103. Furthermore, the NoC 103 on the HPS 104 may communicate with the SPA controller 112 via another NoC 202 in a processor region 202 including multiple DSP processors 204.

The above use of the term "FPGA" is exemplary, and should be taken to include various types of integrated circuits, including but not limited to commercial FPGA devices, complex programmable logic device (CPLD) devices, configurable application-specific integrated circuit (ASSP) devices, configurable digital signal processing (DSP) and graphics processing unit (GPU) devices, hybrid application-specific integrated circuit (ASIC), programmable devices or devices which are described as ASICs with programmable logic cores or programmable logic devices with embedded ASIC or ASSP cores.

It will be apparent to one of ordinary skill in the art, based on the disclosure and teachings herein, that aspects of the disclosed techniques, as described above, may be implemented in many different forms of software, firmware, and hardware in the implementations illustrated in the figures. The actual software code or specialized hardware used to implement aspects consistent with the principles of the disclosed techniques are not limiting. Thus, the operation and behavior of the aspects of the disclosed techniques were described without reference to the specific software code—it being understood that one of ordinary skill in the art would be able to design software and hardware to implement the aspects based on the description herein.

What is claimed is:
1. A programmable integrated circuit comprising:
configurable circuitry in a first region of the programmable integrated circuit;
an array of signal processing accelerators (SPAs) in a second region of the programmable integrated circuit that is separate from the first region, wherein the array of SPAs is configured to receive input data from the configurable circuitry and is programmable to perform at least a filtering function on the input data to obtain output data; and a configurable interconnect network that configures connections between pairs of SPAs in the array of SPAs.

2. The programmable integrated circuit of claim 1, wherein the array of SPAs is arranged in a two-dimensional mesh of SPAs.

3. The programmable integrated circuit of claim 1, wherein:
the array of SPAs is arranged in at least two two-dimensional meshes of SPAs;
the configurable interconnect network includes one or more connections between the at least two two-dimensional meshes, such that at least one of the at least two two-dimensional meshes is bypassed in a particular configuration of the configurable interconnect network.

4. The programmable integrated circuit of claim 1, wherein the configurable interconnect network is set when the configurable circuitry is configured.

5. The programmable integrated circuit of claim 1, further comprising at least one input memory buffer that provides data to a first SPA in the array of SPAs.

6. The programmable integrated circuit of claim 1, further comprising at least one output memory buffer that receives data from a first SPA in the array of SPAs.

7. The programmable integrated circuit of claim 1, wherein at least some of the SPAs in the array of SPAs each includes at least three memory blocks, an adder, a multiplier, and an accumulator.

8. The programmable integrated circuit of claim 1, wherein at least two SPAs in the array of SPAs are arranged to process the same input data.

9. The programmable integrated circuit of claim 1, further comprising a SPA controller that transmits instructions to the array of SPAs, wherein the SPA controller receives programming instructions from a hard processor subsystem that shares a die with the configurable circuitry.

10. The programmable integrated circuit of claim 9, wherein the hard processor subsystem includes a network-on-a-chip and at least one CPU that communicates with the SPA controller via the network-on-a-chip.

11. The programmable integrated circuit of claim 10, wherein the network-on-a-chip on the hard processor subsystem communicates with the SPA controller via another network-on-a-chip in a processor region including a plurality of digital signal processors (DSPs).

12. The programmable integrated circuit of claim 1, wherein the configurable circuitry further comprises a field programmable gate array (FPGA).

13. A method for configuring a programmable integrated circuit, said programmable integrated circuit including:
configurable circuitry in a first region of the programmable integrated circuit and an array of signal processing accelerators (SPAs) in a second region of the programmable integrated circuit that is separate from the first region; said method comprising:
configuring the array of SPAs to receive input data from the configurable circuitry and to perform at least a filtering function on the input data to obtain output data; and
configuring, using a configurable interconnect network, connections between pairs of SPAs in the array of SPAs.

14. The method of claim 13, wherein the array of SPAs is arranged in a two-dimensional mesh of SPAs.

15. The method of claim 13, wherein:
the array of SPAs is arranged in at least two two-dimensional meshes of SPAs;
the configurable interconnect network includes one or more connections between the at least two two-dimensional meshes, such that at least one of the at least two two-dimensional meshes is bypassed in a particular configuration of the configurable interconnect network.

16. The method of claim 13, further comprising setting the configurable interconnect network when the configurable circuitry is configured.

17. The method of claim 13, wherein the programmable integrated circuit further includes at least one input memory buffer that provides data to a first SPA in the array of SPAs.

18. The method of claim 13, wherein the programmable integrated circuit further includes at least one output memory buffer that receives data from a first SPA in the array of SPAs.

19. The method of claim 13, wherein at least some of the SPAs in the array of SPAs each includes at least three memory blocks, an adder, a multiplier, and an accumulator.

20. The method of claim 13, further comprising arranging at least two SPAs in the array of SPAs to process the same input data.

21. The method of claim 13, further comprising configuring a SPA controller to transmit instructions to the array of SPAs, and to receive programming instructions from a hard processor subsystem that shares a die with the configurable circuitry.

22. The method of claim 21, wherein the hard processor subsystem includes a network-on-a-chip and at least one CPU, the method further comprising configuring the CPU to communicate with the SPA controller via the network-on-a-chip.

23. The method of claim 22, further comprising the network-on-a-chip on the hard processor subsystem to communicate with the SPA controller via another network-on-a-chip in a processor region including a plurality of digital signal processors (DSPs).

24. The method of claim 13, wherein the configurable circuitry includes a field programmable gate array (FPGA).

* * * * *